United States Patent
Zheng et al.

(10) Patent No.: US 7,826,256 B2
(45) Date of Patent: Nov. 2, 2010

(54) STRAM WITH COMPENSATION ELEMENT

(75) Inventors: Yuankai Zheng, Bloomington, MN (US); Dimitar V. Dimitrov, Edina, MN (US); Dexin Wang, Eden Prairie, MN (US); Wei Tian, Bloomington, MN (US); Xiaobin Wang, Chanhassen, MN (US); Xiaohua Lou, Bloomington, MN (US)

(73) Assignee: Seagate Technology LLC, Scotts Valley, CA (US)

( * ) Notice: Subject to any disclaimer, the term of this patent is extended or adjusted under 35 U.S.C. 154(b) by 117 days.

(21) Appl. No.: 12/239,882

(22) Filed: Sep. 29, 2008

(65) Prior Publication Data

US 2010/0078741 A1 Apr. 1, 2010

(51) Int. Cl.
*G11C 7/00* (2006.01)
(52) U.S. Cl. .................................. 365/158; 365/148
(58) Field of Classification Search .................. 365/158, 365/148
See application file for complete search history.

(56) References Cited

U.S. PATENT DOCUMENTS

| | | | |
|---|---|---|---|
| 6,700,753 B2 | 3/2004 | Singleton | |
| 6,714,444 B2 | 3/2004 | Huai | |
| 6,829,161 B2 | 12/2004 | Huai | |
| 6,838,740 B2 | 1/2005 | Huai | |
| 6,847,547 B2 | 1/2005 | Albert | |
| 6,888,742 B1 | 5/2005 | Nguyen | |
| 6,933,155 B2 | 8/2005 | Albert | |
| 6,958,927 B1 | 10/2005 | Nguyen | |
| 6,967,863 B2 | 11/2005 | Huai | |
| 6,985,385 B2 | 1/2006 | Nguyen | |
| 6,992,359 B2 | 1/2006 | Nguyen | |
| 7,057,921 B2 | 6/2006 | Valet | |
| 7,088,609 B2 | 8/2006 | Valet | |
| 7,110,287 B2 | 9/2006 | Huai | |
| 7,126,202 B2 | 10/2006 | Huai | |
| 7,139,188 B2* | 11/2006 | Moore et al. | 365/148 |
| 7,154,769 B2* | 12/2006 | Krieger et al. | 365/148 |
| 7,161,829 B2 | 1/2007 | Huai | |
| 7,190,611 B2 | 3/2007 | Nguyen | |
| 7,224,598 B2* | 5/2007 | Perner | 365/148 |

(Continued)

FOREIGN PATENT DOCUMENTS

EP  1 903 624  3/2008

(Continued)

OTHER PUBLICATIONS

Zheng et al., Low Switching Current Flux-Closed Magnetoresistive Random Access Memory, Journal of Applied Physics, May 15 2003.

(Continued)

*Primary Examiner*—Michael T Tran
(74) *Attorney, Agent, or Firm*—Campbell Nelson Whipps LLC

(57) ABSTRACT

Spin-transfer torque memory having a compensation element is disclosed. The spin-transfer torque memory unit includes a synthetic antiferromagnetic reference element, a synthetic antiferromagnetic compensation element, a free magnetic layer between the synthetic antiferromagnetic reference element and the synthetic antiferromagnetic compensation element, and an electrically insulating and non-magnetic tunneling barrier layer separating the free magnetic layer from the synthetic antiferromagnetic reference element. The free magnetic layer has a saturation moment value greater than 1100 emu/cc.

24 Claims, 4 Drawing Sheets

U.S. PATENT DOCUMENTS

| | | |
|---|---|---|
| 7,230,845 B1 | 6/2007 | Wang |
| 7,233,039 B2 | 6/2007 | Huai |
| 7,241,631 B2 | 7/2007 | Huai |
| 7,242,045 B2 | 7/2007 | Nguyen |
| 7,242,048 B2 | 7/2007 | Huai |
| 7,245,462 B2 | 7/2007 | Huai |
| 7,369,427 B2 | 5/2008 | Diao |
| 7,430,135 B2 | 9/2008 | Huai |
| 7,486,551 B1 | 2/2009 | Li |
| 7,486,552 B2 | 2/2009 | Apalkov |
| 7,489,541 B2 | 2/2009 | Pakala |
| 7,518,835 B2 | 4/2009 | Huai |
| 7,576,956 B2 | 8/2009 | Huai |
| 2006/0018057 A1 | 1/2006 | Huai |
| 2006/0049472 A1 | 3/2006 | Diao |
| 2009/0050991 A1 | 2/2009 | Nagai |
| 2009/0302403 A1 | 12/2009 | Nguyen |

FOREIGN PATENT DOCUMENTS

| | | |
|---|---|---|
| EP | 1 918 937 | 5/2008 |
| EP | 1 970 911 | 9/2008 |

OTHER PUBLICATIONS

Egelhoff et al., Oxygen as a Surfactant in the Growth of Giant Magnetoresistance Spin Valves, Journal of Applied Physics 82 (12), Dec. 15 1997.

Slonczewski, Current-Driven Excitation of Magnetic Multilayers, Journal of Magnetism and Magnetic Materials 159 (1996) L1-L7.

Sun, Current-Driven Magnetic Switching in Manganite Trilayer Junctions, Journal of Magnetism and Magnetic Materials 202 (1999) 157-162.

Li et al., Role of Oxygen Exposure in Different Positions in the Synthetic Spin Valves, Journal of Applied Physics, vol. 93, No. 10, May 15 2003.

U.S. Appl. No. 12/239,887, filed Sep. 29, 2008, Inventor: Zheng.

U.S. Appl. No. 12/239,884, filed Sep. 29, 2008, Inventor: Zheng.

PCT Search Report and Written Opinion dated Mar. 3, 2010.

* cited by examiner

STRAM WITH COMPENSATION ELEMENT

BACKGROUND

Fast growth of the pervasive computing and handheld/communication industry generates exploding demand for high capacity nonvolatile solid-state data storage devices. It is believed that nonvolatile memories, especially flash memory, will replace DRAM to occupy the biggest share of memory market. However, flash memory has several drawbacks such as slow access speed (~ms write and ~50-100 ns read), limited endurance (~$10^3$-$10^4$ programming cycles), and the integration difficulty in system-on-chip (SoC). Flash memory (NAND or NOR) also faces significant scaling problems at 32 nm node and beyond.

Magneto-resistive Random Access Memory (MRAM) is another promising candidate for future nonvolatile and universal memory. MRAM features non-volatility, fast writing/reading speed (<10 ns), almost unlimited programming endurance (>$10^{15}$ cycles) and zero standby power. The basic component of MRAM is a magnetic tunneling junction (MTJ). Data storage is realized by switching the resistance of MTJ between a high-resistance state and a low-resistance state. MRAM switches the MTJ resistance by using a current induced magnetic field to switch the magnetization of MTJ. As the MTJ size shrinks, the switching magnetic field amplitude increases and the switching variation becomes severer. Hence, the incurred high power consumption limits the scaling of conventional MRAM.

Recently, a new write mechanism, which is based upon spin polarization current induced magnetization switching, was introduced to the MRAM design. This new MRAM design, called Spin-Transfer Torque RAM (STRAM), uses a (bidirectional) current through the MTJ to realize the resistance switching. Therefore, the switching mechanism of STRAM is constrained locally and STRAM is believed to have a better scaling property than the conventional MRAM.

However, a number of yield-limiting factors must be overcome before STRAM enters the production stage. One concern in traditional STRAM design is the thickness tradeoff between of the free layer of the STRAM cell. A thicker free layer improves the thermal stability and data retention but also increases the switching current requirement since it is proportional to the thickness of the free layer. Thus, the amount of current required to switch the STRAM cell between resistance data states is large.

BRIEF SUMMARY

The present disclosure relates to a spin-transfer torque memory unit that includes a compensation element.

In one particular embodiment, a spin-transfer torque memory unit includes a synthetic antiferromagnetic reference element, a synthetic antiferromagnetic compensation element, a free magnetic layer between the synthetic antiferromagnetic reference element and the synthetic antiferromagnetic compensation element, and an electrically insulating and non-magnetic tunneling barrier layer separating the free magnetic layer from the synthetic antiferromagnetic reference element. The free magnetic layer has a saturation moment value greater than 1100 emu/cc.

These and various other features and advantages will be apparent from a reading of the following detailed description.

BRIEF DESCRIPTION OF THE DRAWINGS

The disclosure may be more completely understood in consideration of the following detailed description of various embodiments of the disclosure in connection with the accompanying drawings, in which.

The figures are not necessarily to scale. Like numbers used in the figures refer to like components. However, it will be understood that the use of a number to refer to a component in a given figure is not intended to limit the component in another figure labeled with the same number.

DETAILED DESCRIPTION

Figure 1:
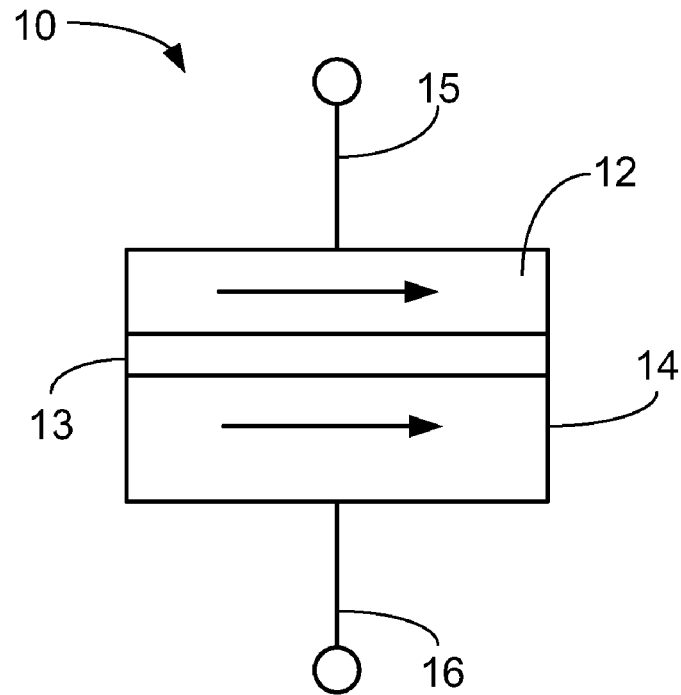
FIG. 1 is a cross-sectional schematic diagram of an illustrative magnetic tunneling junction (MTJ) in the low resistance state.

In the following description, reference is made to the accompanying set of drawings that form a part hereof and in which are shown by way of illustration several specific embodiments. It is to be understood that other embodiments are contemplated and may be made without departing from the scope or spirit of the present disclosure. The following detailed description, therefore, is not to be taken in a limiting sense. The definitions provided herein are to facilitate understanding of certain terms used frequently herein and are not meant to limit the scope of the present disclosure.

Unless otherwise indicated, all numbers expressing feature sizes, amounts, and physical properties used in the specification and claims are to be understood as being modified in all instances by the term "about." Accordingly, unless indicated to the contrary, the numerical parameters set forth in the foregoing specification and attached claims are approximations that can vary depending upon the desired properties sought to be obtained by those skilled in the art utilizing the teachings disclosed herein.

The recitation of numerical ranges by endpoints includes all numbers subsumed within that range (e.g. 1 to 5 includes 1, 1.5, 2, 2.75, 3, 3.80, 4, and 5) and any range within that range.

As used in this specification and the appended claims, the singular forms "a", "an", and "the" encompass embodiments having plural referents, unless the content clearly dictates otherwise. As used in this specification and the appended claims, the term "or" is generally employed in its sense including "and/or" unless the content clearly dictates otherwise.

The present disclosure relates to a spin-transfer torque memory (STRAM) that includes a compensation element. The STRAM includes a reference layer, high Ms (i.e., saturation moment) free layer, additional offset field compensate layer, and an insulator layer that can be specular. The specular insulator layer can enhance the spin current efficiency on the free layer. The disclosed STRAM constructions utilize a high Ms free layer to maintain the high thermal stability, an insulator specular spacer to maintain the low switching current, and a compensate fixed layer to compensate the interlayer coupling from the reference layer. After introducing the compensate layer, the static field can be removed, thus a balanced reference and compensate layer can be used. The offset field will only dependent on the intrinsic interlayer coupling. The offset field variation can be minimized. The disclosed STRAM structures can increase the thermal barrier energy, reduce the switching current and reduce the offset field and its variation. Thus, low switching current, high thermal stability, large signal, small offset field and small offset field variation can be achieved with the disclosed STRAM constructions. In this disclosure, a free layer with a high Ms of more than 1100 emu/cc is used to increase the thermal energy barrier significantly, thus, a large free layer aspect ratio is not required. While the present disclosure is not so limited, an appreciation of various aspects of the disclosure will be gained through a discussion of the examples provided below.

Figure 2:
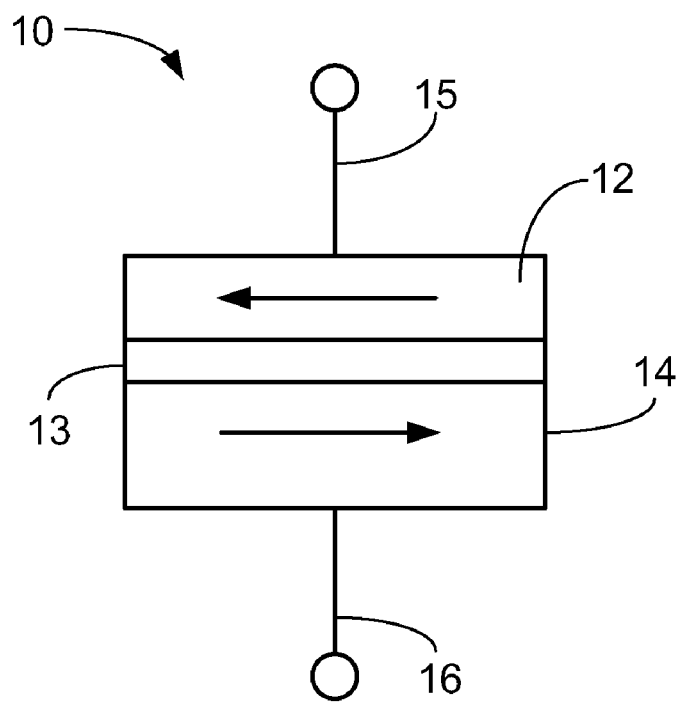
FIG. 2 is a cross-sectional schematic diagram of the illustrative MTJ in the high resistance state.

FIG. 1 is a cross-sectional schematic diagram of an illustrative magnetic tunneling junction (MTJ) cell 10 in the low resistance state and FIG. 2 is a cross-sectional schematic diagram of the illustrative MTJ cell 10 in the high resistance state. The MTJ cell can be any memory cell that can switch between a high resistance state and a low resistance state. In many embodiments, the variable resistive memory cell described herein is a spin-transfer torque memory cell.

The MTJ cell 10 includes a ferromagnetic free layer 12 and a ferromagnetic reference (i.e., pinned) layer 14. The ferromagnetic free layer 12 and a ferromagnetic reference layer 14 are separated by an oxide barrier layer 13 or tunneling barrier layer. A first electrode 15 is in electrical contact with the ferromagnetic free layer 12 and a second electrode 16 is in electrical contact with the ferromagnetic reference layer 14. The ferromagnetic layers 12, 14 may be made of any useful ferromagnetic (FM) alloys such as, for example, Fe, Co, Ni and the insulating tunneling barrier layer 13 may be made of an electrically insulating material such as, for example an oxide material (e.g., $Al_2O_3$ or MgO). Other suitable materials may also be used.

The electrodes 15, 16 electrically connect the ferromagnetic layers 12, 14 to a control circuit providing read and write currents through the ferromagnetic layers 12, 14. The resistance across the MTJ cell 10 is determined by the relative orientation of the magnetization vectors or magnetization orientations of the ferromagnetic layers 12, 14. The magnetization direction of the ferromagnetic reference layer 14 is pinned in a predetermined direction while the magnetization direction of the ferromagnetic free layer 12 is free to rotate under the influence of a spin torque. Pinning of the ferromagnetic reference layer 14 may be achieved through, e.g., the use of exchange bias with an antiferromagnetically ordered material such as PtMn, IrMn and others.

FIG. 1 illustrates the MTJ cell 10 in the low resistance state where the magnetization orientation of the ferromagnetic free layer 12 is parallel and in the same direction of the magnetization orientation of the ferromagnetic reference layer 14. This is termed the low resistance state or "0" data state. FIG. 2 illustrates the MTJ cell 10 in the high resistance state where the magnetization orientation of the ferromagnetic free layer 12 is anti-parallel and in the opposite direction of the magnetization orientation of the ferromagnetic reference layer 14. This is termed the high resistance state or "1" data state.

Switching the resistance state and hence the data state of the MTJ cell 10 via spin-transfer occurs when a current, passing through a magnetic layer of the MTJ cell 10, becomes spin polarized and imparts a spin torque on the free layer 12 of the MTJ cell 10. When a sufficient spin torque is applied to the free layer 12, the magnetization orientation of the free layer 12 can be switched between two opposite directions and accordingly the MTJ cell 10 can be switched between the parallel state (i.e., low resistance state or "0" data state) and anti-parallel state (i.e., high resistance state or "1" data state) depending on the direction of the current.

The illustrative spin-transfer torque MTJ cell 10 may be used to construct a memory device that includes multiple variable resistive memory cells where a data bit is stored in magnetic tunnel junction cell by changing the relative magnetization state of the free magnetic layer 12 with respect to the pinned magnetic layer 14. The stored data bit can be read out by measuring the resistance of the cell which changes with the magnetization direction of the free layer relative to the pinned magnetic layer. In order for the spin-transfer torque MTJ cell 10 to have the characteristics of a non-volatile random access memory, the free layer exhibits thermal stability against random fluctuations so that the orientation of the free layer is changed only when it is controlled to make such a change. This thermal stability can be achieved via the magnetic anisotropy using different methods, e.g., varying the bit size, shape, and crystalline anisotropy. Additional anisotropy can be obtained through magnetic coupling to other magnetic layers either through exchange or magnetic fields. Generally, the anisotropy causes a soft and hard axis to form in thin magnetic layers. The hard and soft axes are defined by the magnitude of the external energy, usually in the form of a magnetic field, needed to fully rotate (saturate) the direction of the magnetization in that direction, with the hard axis requiring a higher saturation magnetic field.

Figure 3:
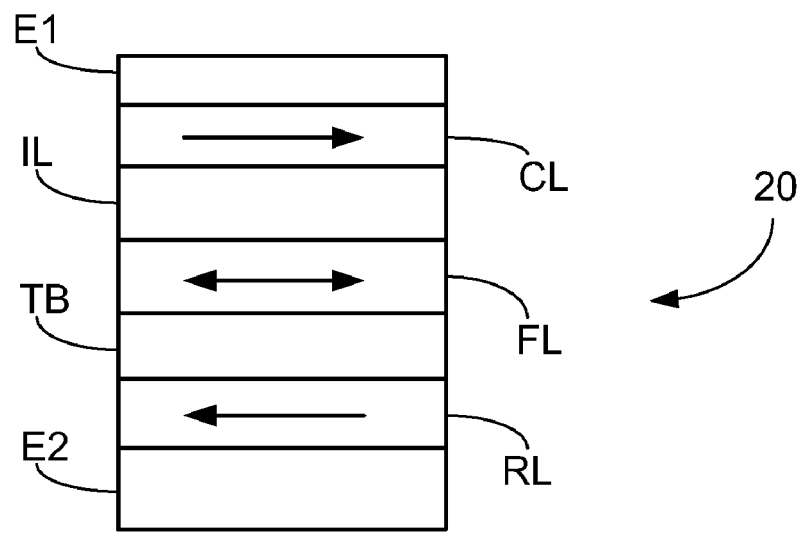
FIG. 3 is a schematic diagram of an illustrative spin-transfer torque memory unit.
Figure 5:
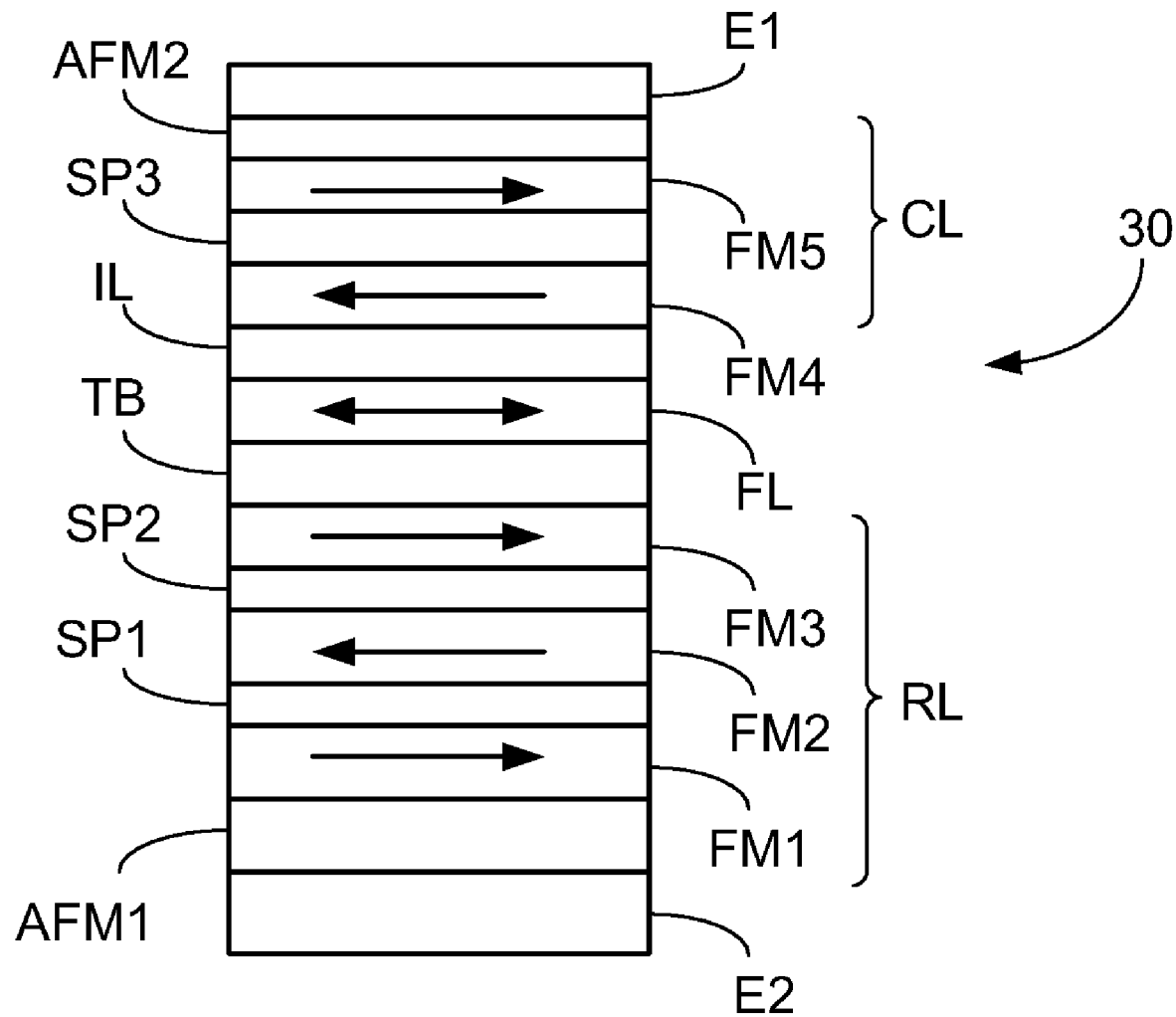
FIG. 5 is a schematic diagram of an illustrative spin-transfer torque memory unit including a multilayer reference layer.
Figure 6:
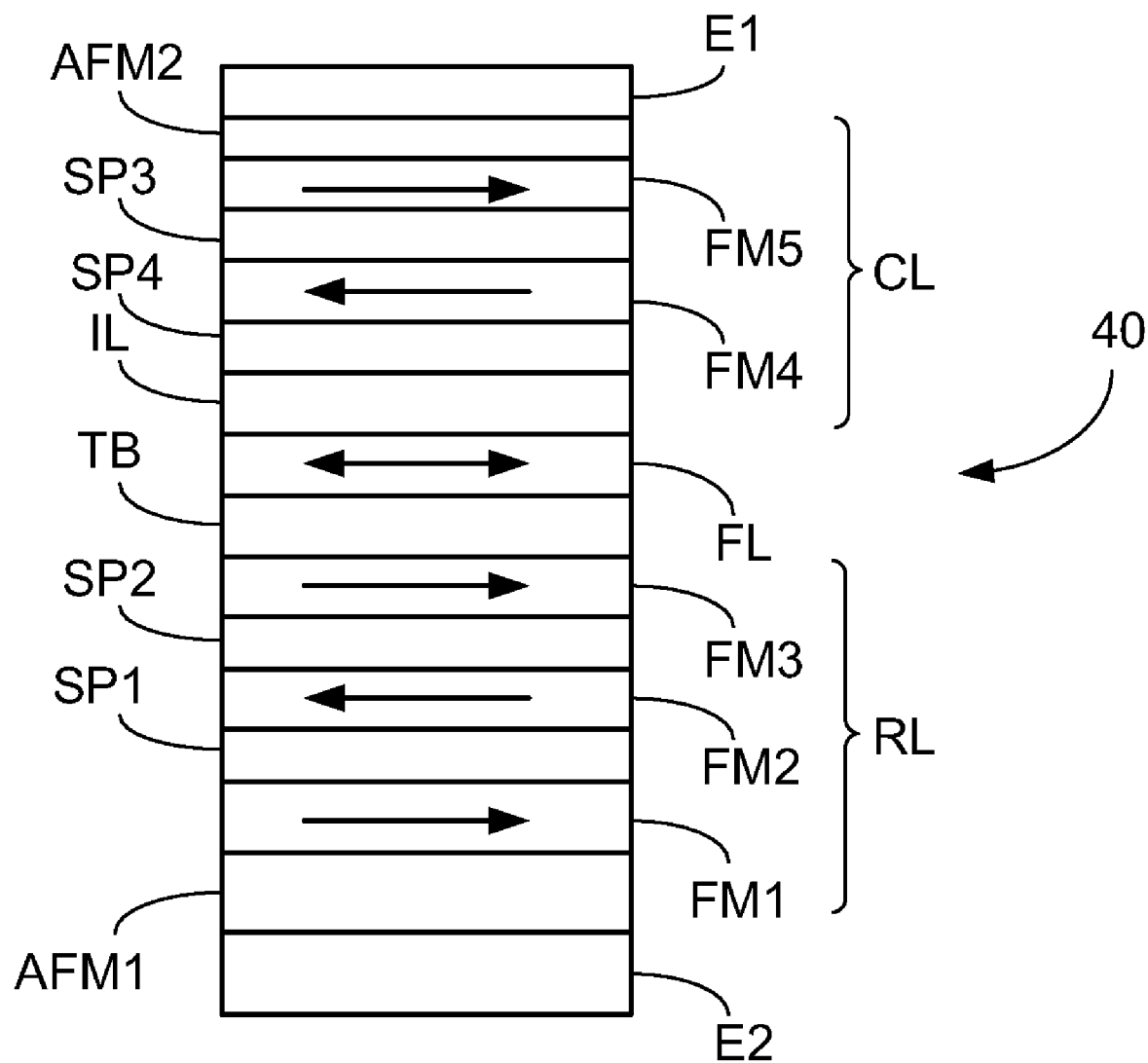
FIG. 6 is a schematic diagram of another illustrative spin-transfer torque memory unit including a multilayer reference layer and an additional spacer layer.

FIG. 3 is a schematic diagram of an illustrative spin-transfer torque memory unit 20. The spin-transfer torque memory unit 20 includes a free magnetic element or layer FL, a reference magnetic element or layer RL, and an electrically insulating and non-magnetic tunneling barrier layer TB separating the multilayer free magnetic layer FL from the reference magnetic layer RL. The spin-transfer torque memory unit 20 further includes a compensation layer CL and an electrically insulating layer IL separating the compensation layer CL from the free magnetic layer FL. While the compensation layer CL and the reference magnetic layer RL are illustrated as a single layer, it is understood that the compensation layer CL and the reference magnetic layer RL can be multilayer structures, as illustrated in FIG. 5 and FIG. 6.

The magnetization moment of the compensation layer CL is opposite that of the reference layer RL. Interlayer coupling from the reference layer RL can be compensated by the interlayer coupling from the compensation layer CL. As the net coupling field can be near zero, the static field from both the reference layer RL and the compensation layer CL can be removed. The static field is size dependent, and the interlayer coupling isn't size dependent, so the variation of the offset field can be minimized.

The reference magnetic layer RL can be any useful ferromagnetic material with an acceptable spin polarization range of more than 0.5, as described above. The free magnetic layer FL can be any ferromagnetic material with acceptable anisotropy and a saturation moment (i.e., Ms) value that is greater than 1100 emu/cc or greater than 1500 emu/cc. EMU refers to electromagnetic unit of magnetic dipole moment and cc refers to cubic centimeter. In many embodiments, the free magnetic layer FL is $Co_{100-X-Y}Fe_XB_Y$ wherein X is a value being greater than 30 and Y is a value being greater than 15.

The compensation layer CL can be any useful ferromagnetic material with an acceptable spin polarization range from 0.2 to 0.9. The electrically insulating layer IL can be any useful electrically insulating material. In some embodiments, the electrically insulating layer IL is an electronically electrically insulating and electronically reflective layer. The spin polarization from the free layer FL—electrically insulating layer IL—compensation layer CL in one embodiment is less than 0.4.

The electrically insulating and electronically reflective layer can be a thin oxide layer or nitride layer and formed of any useful electrically insulating and electronically reflective material such as, for example, MgO, SiO, TiO, AlO, TaO, NiO, TaN, or AlN. The thickness of the electrically insulating and electronically reflective layer can be in a range from 3 to 15 Angstroms, or from 5 to 15 Angstroms. The electrically insulating and electronically reflective layer can have an area resistance from 1 to 50 ohms$\mu m^2$ or from 1 to 20 ohms$\mu m^2$.

The electrically insulating and electronically reflective layer is able to reflect at least a portion of electrons back into the free magnetic layer FL and allows at least a portion of the electrons to pass through the electrically insulating and electronically reflective layer. These reflected electrons are able to enhance the spin current efficiency, effectively reducing the amount of current that needs to be applied through the flux-closed spin-transfer torque memory unit 20 to switch the memory unit 20 between the parallel state (i.e., low resistance state or "0" data state) and anti-parallel state (i.e., high resistance state or "1" data state). Thus, since the electrically insulating and electronically reflective layer can reflect the spin electrons to increase the spin current efficiency, the switching current can be reduced significantly.

The first electrode layer E1 and the second electrode layer E2 provide a current of electrons that can switch the magnetization orientation of the multilayer free magnetic layer FL between two opposite directions and accordingly the spin-transfer torque memory unit 20 can be switched between the parallel state (i.e., low resistance state or "0" data state) and anti-parallel state (i.e., high resistance state or "1" data state) depending on the direction of the current, as described above.

In some embodiments, the electrically insulating and electronically reflective layer IL can have a non-uniform thickness. The canted current resulting from this can further increase the spin efficiency to further reduce the switching current. The non-uniform electrically insulating and electronically reflective layer IL can also reduce the serial resistance to maintain the output signal. While two embodiments of a non-uniform electrically insulating and electronically reflective layer IL are shown and described below, it is understood that any non-uniform electrically insulating and electronically reflective layer IL structure is within the scope of this disclosure.

Figure 4A:
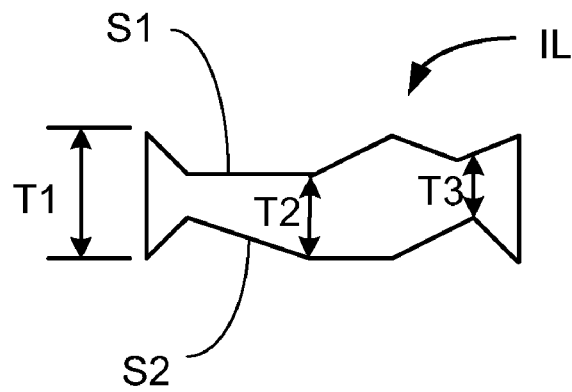
FIG. 4A is a schematic cross-sectional diagram of an illustrative non-uniform electrically insulating and electronically reflective layer.

FIG. 4A is a schematic cross-sectional diagram of an illustrative non-uniform electrically insulating and electronically reflective layer IL. In this illustrated embodiment of a electrically insulating and electronically reflective layer IL having a non-uniform thickness the electrically insulating and electronically reflective layer ER has opposing major surfaces S1 and S2 defining peaks and valleys and provide the electrically insulating and electronically reflective layer IL with a plurality of varying thicknesses T1, T2 and T3. Current travels through the opposing non-planar major surfaces S1 and S2 along a thickness direction of the electrically insulating and electronically reflective layer IL.

Figure 4B:
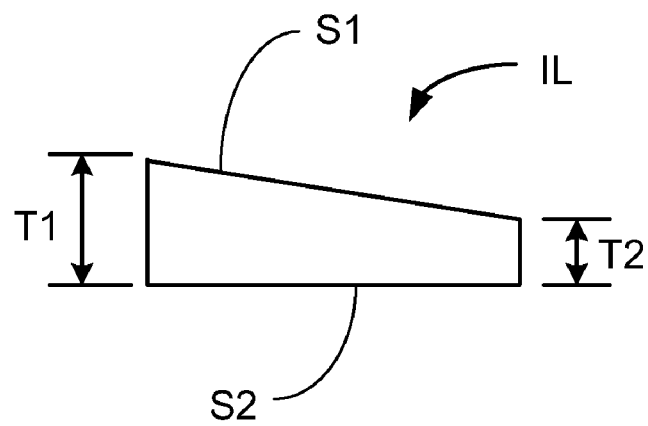
FIG. 4B is a schematic cross-sectional diagram of another illustrative non-uniform electrically insulating and electronically reflective layer.

FIG. 4B is a schematic cross-sectional diagram of another illustrative non-uniform electrically insulating and electronically reflective layer IL. In this illustrated embodiment of a electrically insulating and electronically reflective layer IL having a non-uniform thickness the electrically insulating and electronically reflective layer IL has opposing planar major surfaces S1 and S2. The opposing planar major surfaces S1 and S2 define a continuous sloping electrically insulating and electronically reflective layer IL with a first thickness T1 and decreasing to a second thickness T2. Current travels through the opposing non-planar major surfaces S1 and S2 along a thickness direction of the electrically insulating and electronically reflective layer IL.

FIG. 5 is a schematic diagram of another illustrative spin-transfer torque memory unit 30. This embodiment is similar to FIG. 3 except that the compensation layer CL is a synthetic antiferromagnetic compensation element CL and the reference layer RL is a synthetic antiferromagnetic reference element RL.

The spin-transfer torque memory unit 30 includes a free magnetic layer FL, a synthetic antiferromagnetic reference magnetic element RL and an electrically insulating and non-magnetic tunneling barrier layer TB separating the free magnetic element FL from the synthetic antiferromagnetic reference magnetic element RL, as described above. An electrically insulating layer IL separates a synthetic antiferromagnetic compensation element CL from the free magnetic layer FL.

The synthetic antiferromagnetic reference element RL includes a first ferromagnetic layer FM1 and a second ferromagnetic layer FM2 separated by a first spacer layer SP1 and a third ferromagnetic layer FM3 separated from the second ferromagnetic layer FM2 by a second spacer layer SP2. The first ferromagnetic layer FM1, a second ferromagnetic layer FM2, and third ferromagnetic layer FM3 are antiferromagnetically coupled to each other. A first antiferromagnetic layer AFM1 is adjacent to the first ferromagnetic layer FM1. The first ferromagnetic layer FM1, a second ferromagnetic layer FM2, and third ferromagnetic layer FM3 are formed from a ferromagnetic material having a spin polarization of more than 0.5.

The synthetic antiferromagnetic compensation element CL includes a fourth ferromagnetic layer FM4 and a fifth ferromagnetic layer FM5 separated by a third spacer layer SP3. The fourth ferromagnetic layer FM4 and fifth ferromagnetic layer FM5 are antiferromagnetically coupled to each other. A second antiferromagnetic layer AFM2 is adjacent to the fifth ferromagnetic layer FM5. The fourth ferromagnetic layer FM4 and fifth ferromagnetic layer FM5 are formed from a ferromagnetic material having a spin polarization in a range from 0.2 to 0.9. The spin polarization from the free layer FL—electrically insulating layer IL—compensation layer CL is less than 0.4.

The spacer layers SP1, SP2 and SP3 can be any useful electrically conducting and non-ferromagnetic material such as, for example, Ru, Pd, or Cr. The anti-ferromagnetic layers AFM1 and AFM2 pin the ferromagnetic layers through, e.g., the use of exchange bias with an antiferromagnetically ordered material such as PtMn, IrMn, and others.

There are a number of advantages of using a synthetic anti-ferromagnetic element in the disclosed spin-transfer torque memory units. Some advantages include that the static field of the free layer is reduced, the thermal stability of the reference layer is improved, and interlayer diffusion is reduced.

The free magnetic layer FL can be any ferromagnetic material with acceptable anisotropy and a saturation moment (i.e., Ms) value that is greater than 1100 emu/cc or greater than 1500 emu/cc. In many embodiments, the free magnetic layer FL is $Co_{100-X-Y}Fe_XB_Y$ wherein X is a value being greater than 30 and Y is a value being greater than 15.

The electrically insulating layer IL can be any useful electrically insulating material. In some embodiments, the electrically insulating layer IL is an electrically insulating and electronically reflective layer, as described above.

The first electrode layer E1 and the second electrode layer E2 provide a current of electrons that can switch the magnetization orientation of the multilayer free magnetic layer FL between two opposite directions and accordingly the spin-transfer torque memory unit 20 can be switched between the parallel state (i.e., low resistance state or "0" data state) and anti-parallel state (i.e., high resistance state or "1" data state) depending on the direction of the current, as described above.

FIG. 6 is a schematic diagram of another illustrative spin-transfer torque memory unit 40. This embodiment is similar to FIG. 5 except that a fourth spacer layer SP4 separates the compensation fourth ferromagnetic layer FM4 from the electrically insulating layer IL. The fourth spacer layer SP4 is an electrically conductive and non-ferromagnetic material such as, Ta, Cu, Al, Mg, or Au. The fourth spacer layer SP4 aids in controlling the compensation element CL interlayer coupling.

The spin-transfer torque memory unit 30 includes a free magnetic layer FL, a synthetic antiferromagnetic reference magnetic element RL and an electrically insulating and non-magnetic tunneling barrier layer TB separating the free magnetic element FL from the synthetic antiferromagnetic reference magnetic element RL, as described above. An electrically insulating layer IL and the fourth spacer layer SP4 separates a synthetic antiferromagnetic compensation element CL from the free magnetic layer FL.

The synthetic antiferromagnetic reference element RL includes a first ferromagnetic layer FM1 and a second ferromagnetic layer FM2 separated by a first spacer layer SP1 and a third ferromagnetic layer FM3 separated from the second ferromagnetic layer FM2 by a second spacer layer SP2. The first ferromagnetic layer FM1, a second ferromagnetic layer FM2, and third ferromagnetic layer FM3 are antiferromagnetically coupled to each other. A first antiferromagnetic layer AFM1 is adjacent to the first ferromagnetic layer FM1. The first ferromagnetic layer FM1, a second ferromagnetic layer FM2, and third ferromagnetic layer FM3 are formed from a ferromagnetic material having a spin polarization of more than 0.5.

The synthetic antiferromagnetic compensation element CL includes a fourth ferromagnetic layer FM4 and a fifth ferromagnetic layer FM5 separated by a third spacer layer SP3. The fourth ferromagnetic layer FM4 and fifth ferromagnetic layer FM5 are antiferromagnetically coupled to each other. A second antiferromagnetic layer AFM2 is adjacent to the fifth ferromagnetic layer FM5. The fourth ferromagnetic layer FM4 and fifth ferromagnetic layer FM5 are formed from a ferromagnetic material having a spin polarization in a range from 0.2 to 0.9. The spin polarization from the free magnetic layer FL—electrically insulating and electronically reflective layer IL—synthetic antiferromagnetic compensation layer CL is less than 0.4.

The spacer layers SP1, SP2 and SP3 can be any useful electrically conducting and non-ferromagnetic material such as, for example, Ru, Pd, or Cr. The anti-ferromagnetic layers AFM1 and AFM2 pin the ferromagnetic layers through, e.g., the use of exchange bias with an antiferromagnetically ordered material such as PtMn, IrMn, and others.

There are a number of advantages of using a synthetic anti-ferromagnetic element in the disclosed spin-transfer torque memory units. Some advantages include that the static field of the free layer is reduced, the thermal stability of the reference layer is improved, and interlayer diffusion is reduced.

The free magnetic layer FL can be any ferromagnetic material with acceptable anisotropy and a saturation moment (i.e., Ms) value that is greater than 1100 emu/cc or greater than 1500 emu/cc. In many embodiments, the free magnetic layer FL is $Co_{100-X-Y}Fe_XB_Y$ wherein X is a value being greater than 30 and Y is a value being greater than 15.

The electrically insulating layer IL can be any useful electrically insulating material. In some embodiments, the electrically insulating layer IL is an electronically electrically insulating and electronically reflective layer, as described above.

The first electrode layer E1 and the second electrode layer E2 provide a current of electrons that can switch the magnetization orientation of the multilayer free magnetic layer FL between two opposite directions and accordingly the spin-transfer torque memory unit 20 can be switched between the parallel state (i.e., low resistance state or "0" data state) and anti-parallel state (i.e., high resistance state or "1" data state) depending on the direction of the current, as described above.

Thus, embodiments of the STRAM WITH COMPENSATION ELEMENT are disclosed. The implementations described above and other implementations are within the scope of the following claims. One skilled in the art will appreciate that the present disclosure can be practiced with embodiments other than those disclosed. The disclosed embodiments are presented for purposes of illustration and not limitation, and the present invention is limited only by the claims that follow.

What is claimed is:

1. A spin-transfer torque memory unit, comprising:
   a synthetic antiferromagnetic reference element;
   a synthetic antiferromagnetic compensation element;
   a free magnetic layer between the synthetic antiferromagnetic reference element and the synthetic antiferromagnetic compensation element, the free magnetic layer having a saturation moment value greater than 1100 emu/cc;
   an electrically insulating and non-magnetic tunneling barrier layer separating the free magnetic layer from the synthetic antiferromagnetic reference element; and
   an electrically insulating layer separating the synthetic antiferromagnetic compensation element from the free magnetic layer, wherein the electrically insulating layer is an electrically insulating and electronically reflective layer.

2. A spin-transfer torque memory unit according to claim 1, wherein the free magnetic element has a saturation moment value greater than 1500 emu/cc.

3. A spin-transfer torque memory unit according to claim 1, wherein the free magnetic element comprises $Co_{100-X-Y}Fe_XB_Y$ wherein X is a value being greater than 30 and Y is a value being greater than 15.

4. A spin-transfer torque memory unit according to claim 1, wherein the electrically insulating layer has a thickness in a range from 3 to 15 Angstroms.

5. A spin-transfer torque memory unit according to claim 4, further comprising an electrically conductive and non-ferromagnetic spacer layer disposed between the synthetic antiferromagnetic compensation element and the electrically insulating layer.

6. A spin-transfer torque memory unit according to claim 5, wherein the synthetic antiferromagnetic compensation element comprises a Ru, Pd or Cr spacer layer and the non-ferromagnetic spacer layer comprises Ta, Cu, Al, Mg, or Au.

7. A spin-transfer torque memory unit according to claim 1, wherein the electrically insulating and electronically reflective layer comprises TaO, AlO, MgO, SiO, TiO, NiO, TaN, or AlN and has an area resistance value in a range from 1 to 50 ohm$\mu$m$^2$.

8. A spin-transfer torque memory unit, comprising:
a synthetic antiferromagnetic reference element;
a synthetic antiferromagnetic compensation element;
a free magnetic layer between the synthetic antiferromagnetic reference element and the synthetic antiferromagnetic compensation element;
an electrically insulating and non-magnetic tunneling barrier layer separating the free magnetic layer from the synthetic antiferromagnetic reference element; and
an electrically insulating and electronically reflective layer having a thickness in a range from 3 to 15 Angstroms and being between the synthetic antiferromagnetic compensation element from the free magnetic layer.

9. A spin-transfer torque memory unit according to claim 8, wherein the electrically insulating and electronically reflective layer comprises TaO, AlO, MgO, SiO, TiO, NiO, TaN, or AlN and has an area resistance value in a range from 1 to 50 ohm$\mu$m$^2$.

10. A spin-transfer torque memory unit according to claim 8, further comprising an electrically conductive and non-ferromagnetic spacer layer disposed between the synthetic antiferromagnetic compensation element and the electrically insulating and electronically reflective layer.

11. A spin-transfer torque memory unit according to claim 10, wherein the synthetic antiferromagnetic compensation element comprises a Ru, Pd or Cr spacer layer and the non-ferromagnetic spacer layer comprises Ta, Cu, Al, Mg, or Au.

12. A spin-transfer torque memory unit according to claim 8, wherein the free magnetic element has a saturation moment value greater than 1100 emu/cc.

13. A spin-transfer torque memory unit according to claim 8, wherein the free magnetic element comprises $Co_{100-X-Y}Fe_XB_Y$ wherein X is a value being greater than 30 and Y is a value being greater than 15.

14. A spin-transfer torque memory unit according to claim 8, wherein the synthetic antiferromagnetic reference element comprises a first ferromagnetic layer, a second ferromagnetic layer and a third magnetic layer antiferromagnetically coupled to each other and a first spacer layer separates the first and second ferromagnetic layers and a second spacer layer separates the second and third ferromagnetic layers, and a first antiferromagetic layer is adjacent to the first ferromagnetic layer, the first, second and third ferromagnetic layers comprise ferromagnetic material having a spin polarization of more than 0.5.

15. A spin-transfer torque memory unit according to claim 14, wherein the synthetic antiferromagnetic compensation element comprises a fourth ferromagnetic layer and a fifth ferromagnetic layer antiferromagnetically coupled to each other and a third spacer layer separates the fourth and fifth ferromagnetic layers, and a second antiferromagetic layer is adjacent to the fifth ferromagnetic layer, the fourth and fifth ferromagnetic layers comprise ferromagnetic material having a spin polarization in a range from 0.2 to 0.9 and, spin polarization from the free magnetic layer/electrically insulating and electronically reflective layer/synthetic antiferromagnetic compensation element is less than 0.4.

16. A spin-transfer torque memory unit, comprising:
a synthetic antiferromagnetic reference element;
a synthetic antiferromagnetic compensation element;
a free magnetic layer between the synthetic antiferromagnetic reference element and the synthetic antiferromagnetic compensation element, the free magnetic element having a saturation moment value greater than 1100 emu/cc;
an electrically insulating and non-magnetic tunneling barrier layer separating the free magnetic layer from the synthetic antiferromagnetic reference element;
an electrically insulating and electronically reflective layer having a thickness in a range from 3 to 15 Angstroms and being between the synthetic antiferromagnetic compensation element from the free magnetic layer; and
an electrically conductive and non-ferromagnetic spacer layer disposed between the synthetic antiferromagnetic compensation element and the electrically insulating and electronically reflective layer.

17. A spin-transfer torque memory unit according to claim 16, wherein the synthetic antiferromagnetic compensation element comprises a Ru, Pd or Cr spacer layer and the non-ferromagnetic spacer layer comprises Ta, Cu, Al, Mg, or Au.

18. A spin-transfer torque memory unit according to claim 16, wherein the free magnetic element has a saturation moment value greater than 1500 emu/cc.

19. A spin-transfer torque memory unit according to claim 16, wherein the synthetic antiferromagnetic reference element has a spin polarization of greater than 0.5 and the spin polarization from the free magnetic layer/electrically insulating and electronically reflective layer/synthetic antiferromagnetic compensation element is less than 0.4.

20. An article, comprising:
a synthetic antiferromagnetic reference element;
a synthetic antiferromagnetic compensation element;
a free magnetic layer between the synthetic antiferromagnetic reference element and the synthetic antiferromagnetic compensation element, the free magnetic layer having a saturation moment value greater than 1100 emu/cc;
an electrically insulating and non-magnetic tunneling barrier layer separating the free magnetic layer from the synthetic antiferromagnetic reference element; and
an electrically insulating layer separating the synthetic antiferromagnetic compensation element from the free magnetic layer wherein the electrically insulating layer is an electrically insulating and electronically reflective layer.

21. An article according to claim 20, wherein the free magnetic element has a saturation moment value greater than 1500 emu/cc.

22. An article according to claim 20, wherein the free magnetic element comprises $Co_{100-X-Y}Fe_XB_Y$ wherein X is a value being greater than 30 and Y is a value being greater than 15.

23. An article according to claim 20, wherein the electrically insulating layer has a thickness in a range from 3 to 15 Angstroms.

24. An article according to claim 23, further comprising an electrically conductive and non-ferromagnetic spacer layer disposed between the synthetic antiferromagnetic compensation element and the electrically insulating layer.

* * * * *